(12) United States Patent
Yi et al.

(10) Patent No.: US 6,335,543 B1
(45) Date of Patent: Jan. 1, 2002

(54) POLYCRYSTALLINE SILICON THIN FILM TRANSISTOR AND MANUFACTURING METHOD THEREOF

(75) Inventors: Jonghoon Yi; Sanggul Lee, both of Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/533,712

(22) Filed: Mar. 23, 2000

(51) Int. Cl.⁷ ................................................. H01L 29/04
(52) U.S. Cl. ........................... 257/72; 257/57; 257/522; 438/149; 438/411
(58) Field of Search ............................. 438/149, 411; 257/522, 57, 72, 435, 384

(56) References Cited

U.S. PATENT DOCUMENTS 5,397,904 A * 3/1995 Arney et al.
5,614,728 A * 3/1997 Akiyama

FOREIGN PATENT DOCUMENTS

| EP | 0783124 | 7/1997 |
|----|---------|--------|
| JP | 1100518 | 4/1989 |

* cited by examiner

Primary Examiner—Caridad Everhart

(57) ABSTRACT

The present invention discloses a polycrystalline silicon thin film transistor connected to a gate line and a data line, including a source electrode contacting the data line; a gate electrode contacting the gate line; a drain electrode spaced apart from the source electrode; a polysilicon layer having upper and lower surfaces, the lower surface having a contacting area and a noncontacting area, the polysilicon layer being positioned between and contacting the source and the drain electrodes, and acting as a channel in which electrons flow; and a buffer layer positioned under the polysilicon layer, the buffer layer having a supporting portion, the supporting portion supporting the lower surface of the polysilicon layer through the contact area of the lower surface of the polysilicon layer, thereby forming a space between the buffer layer and the noncontacting area of the lower surface of the polysilicon layer.

11 Claims, 5 Drawing Sheets

POLYCRYSTALLINE SILICON THIN FILM TRANSISTOR AND MANUFACTURING METHOD THEREOF

CROSS REFERENCE

This application claims the benefit of Korean Patent Application No. 1999-10099, filed on Mar. 24, 1999, under 35 U.S.C. §119, the entirety of which is hereby incorporated by reference.

BACKGROUND OF THE INVENTION

1. Field of the invention

The present invention relates to a thin film transistor (TFT), and more particularly, to a polycrystalline silicon thin film transistor (Poly-Si TFT) and a method of manufacturing the same.

2. Description of Related Art

Conventional polycrystalline silicon thin film transistors (hereinafter referred to simply as "Poly-Si TFTs") are commonly employed in high-density static random access memory cells (SRAMs) for load pull-up devices, as well as used for both switching elements and peripheral driver circuitry in large-area active-matrix liquid crystal displays (LCDs).

FIG. 1 is a plan view illustrating a typical Poly-Si TFT of a coplanar type for use in a liquid crystal display device, and FIG. 2 is a cross-sectional view taken along line II—II of FIG. 1. As shown in FIGS. 1 and 2, gate lines 60 are arranged in a transverse direction and data lines 70 are arranged in a longitudinal direction perpendicular to the gate lines 60 such that pixel regions having a pixel electrodes 40 is defined by the gate lines 60 and the data lines 70. The Poly-Si TFT 50 is formed near the cross point of the gate lines 60 and the data lines 70. The Poly-Si TFTs 50 have a gate electrode 60a extended from the gate line 60, a source electrode 70a extended from the data line 70, a drain electrode 70b contacted with the pixel electrode 40, a polycrystalline silicon layer 90a as an active area of the Poly-Si TFT 50. The overlapped portion 40a of the pixel electrode 40 and the gate line 60 function as capacitor electrodes.

A manufacturing method of the Poly-Si TFT described above will be explained in detail as follows. A buffer layer 30 made of SiNx, SiO$_2$, or BCB (Benzocyclobutene) is formed on a transparent substrate 10. Amorphous silicon is deposited on the buffer layer 30 and patterned to form an amorphous silicon layer (not shown). The amorphous silicon layer is heat-treated using a furnace annealing technique or a laser annealing technique to form a polycrystalline silicon layer 90a. A first insulating layer 55 of SiNx or SiO$_2$ is formed on the polycrystalline silicon layer 90a and the exposed buffer layer 30. A metal layer of Cr, Al, or Mo is deposited over the polycrystalline silicon layer 90a and patterned to form the gate electrode 60a. Impurity ion gas is doped into the polycrystalline silicon layer 90a using the gate electrode 60a as a mask to form an ohmic contact layer on both ends of the polycrystalline silicon layer 90a to define source and drain regions 92 and 94. At this point, the source and drain regions 92 and 94 become n$^+$-type when the doped ion gas is one of a nitrogen group, while the source and drain regions 92 and 94 become p$^+$-type when the doped ion gas is one of a boron group. Sequentially, a second insulating layer 8 is formed over the entire substrate 10 while covering the gate electrode 60a and the first insulating layer 55. Then, contact holes 5a and 5b are formed to respectively expose the source and drain regions 92 and 94. A metal layer of Cr, Al, or Mo is deposited on the second insulating layer 8 and patterned to form source and drain electrodes 70a and 70b respectively contacted with the source and drain regions 92 and 94 through the contact holes 5a and 5b. A third insulating layer 80 of SiNx, SiO$_2$, or BCB is formed over the entire substrate while covering the source and drain electrodes 70a and 70b. A contact hole 80a is formed to expose the drain electrode 70b. Then, a pixel electrode 40 of ITO (Indium Tin Oxide) is formed on the third insulating layer 80 and contacts with the drain electrode 70b through the contact hole 80a.

As shown in FIG. 3, the polycrystalline silicon layer 90a of the Poly-Si TFT has elevated grain boundaries 33 on an upper surface thereof, which are formed due to a heat transfer difference during the heat-treatment process for polycrystallization of the amorphous silicon layer. In other words, polycrystallization of a lower surface of the amorphous silicon layer is performed faster than the upper surface of the amorphous silicon layer. This is because heat of the lower surface of the amorphous silicon layer contacting with the buffer layer 30 transfers relatively faster than heat of the upper surface of the amorphous silicon layer contacting with nothing during the heat-treatment process, leading to a crystal growing speed difference between the upper and lower surfaces of the amorphous silicon layer. Such a crystal growing speed difference due to the heat transfer difference causes elevated grain boundaries on the upper surface of the polycrystalline silicon layer 90a.

In more detail, heat transfers quickly from the amorphous silicon layer to the buffer layer 30 during the heat-treatment process leading to fast polycrystallization of the lower of the amorphous silicon layer, so the crystal tends to grow in a gravity direction. However, the buffer layer 30 prevents the crystals from growing in the gravity direction. Therefore, the crystals grow forward from the upper surface of the amorphous silicon layer that has a crystal growing speed relatively slower than the speed of the lower surface of the amorphous silicon layer.

SUMMARY OF THE INVENTION

An object of the present invention is to provide a Poly-Si TFT having an improved field effect mobility.

In order to achieve the above object, the present invention provides a polycrystalline silicon thin film transistor connected to a gate line and a data line, including a source electrode contacting the data line; a gate electrode contacting the gate line; a drain electrode spaced apart from the source electrode; a polysilicon layer having upper and lower surfaces, the lower surface having a contacting area and a noncontacting area, the polysilicon layer being positioned between and contacting the source and the drain electrodes, and acting as a channel in which electrons flow; and a buffer layer positioned under the polysilicon layer, the buffer layer having a supporting portion, the supporting portion supporting the lower surface of the polysilicon layer through the contact area of the lower surface of the polysilicon layer, thereby forming a space between the buffer layer and the noncontacting area of the lower surface of the polysilicon layer.

The polysilicon layer has an "H" shape. The supporting portion has a corresponding shape to the polysilicon layer, or has two poles, each end of the poles contacting the lower surface of the silicon layer.

The present invention further provides a method of fabricating a thin film transistor, including the steps of providing a substrate; forming a buffer layer on the substrate; forming an amorphous silicon layer on the buffer layer; patterning the amorphous silicon layer; etching the buffer layer using the patterned amorphous silicon layer as a mask to form a noncontacting area in a bottom surface of the amorphous silicon layer; heat-treating the amorphous silicon layer to form a polysilicon layer; forming source and drain electrodes contacting the polysilicon layer; and forming a gate electrode between the source and the drain electrodes.

The heat-treating process is done using a laser annealing technique.

Other features, elements and advantages of the present invention will be described in detail below with reference to preferred embodiments of the present invention and the attached drawings.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF PREFERRED EMBODIMENTS

Reference will now be made in detail to the preferred embodiment of the present invention, example of which is illustrated in the accompanying drawings.

Figure 1:
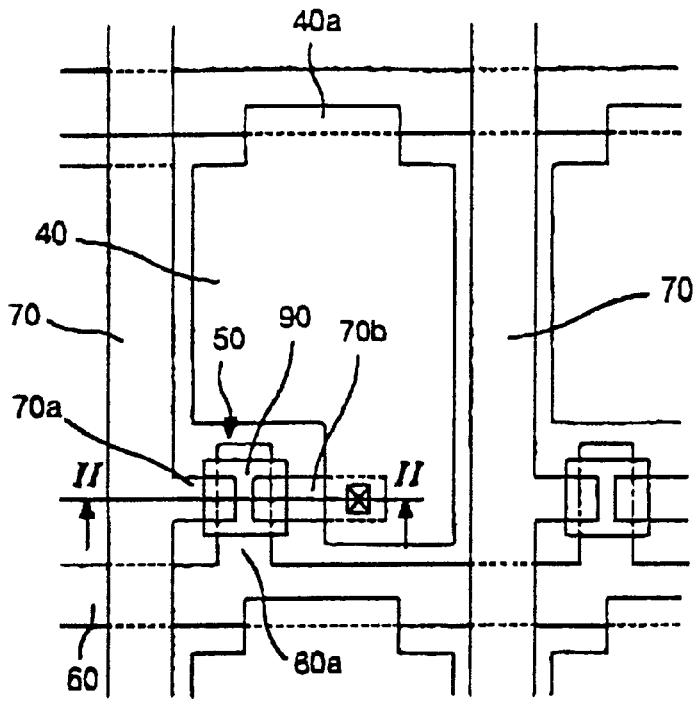
FIG. 1 is a plan view illustrating a typical coplanar type Poly-Si TFT for use in a liquid crystal display.
Figure 2:
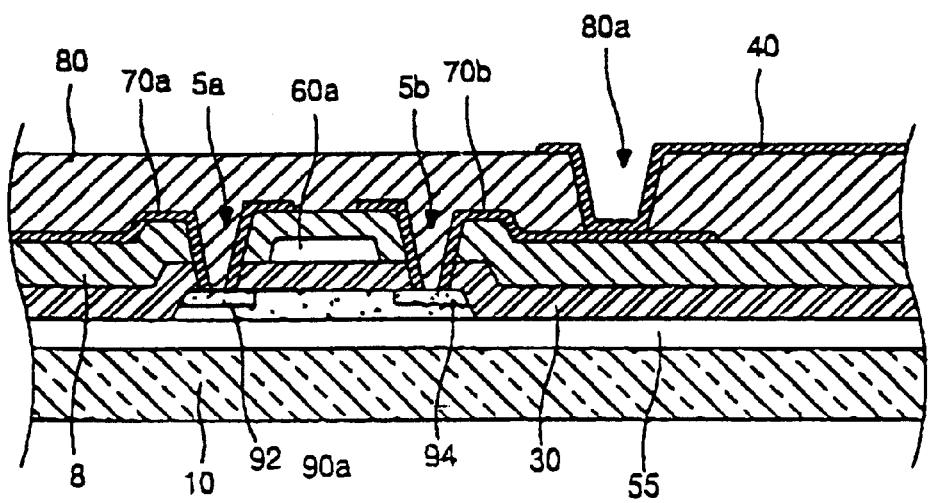
FIG. 2 is a cross-sectional view taken along line II—II of FIG. 1.
Figure 3:
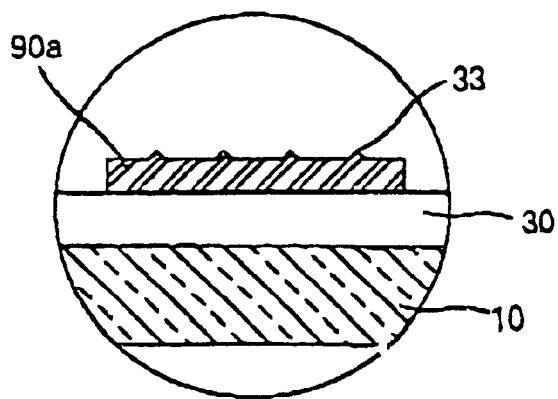
FIG. 3 is an enlarged view illustrating elevated grain boundaries formed on an upper surface of the polycrystalline silicon layer of FIG. 2.
Figure 4:
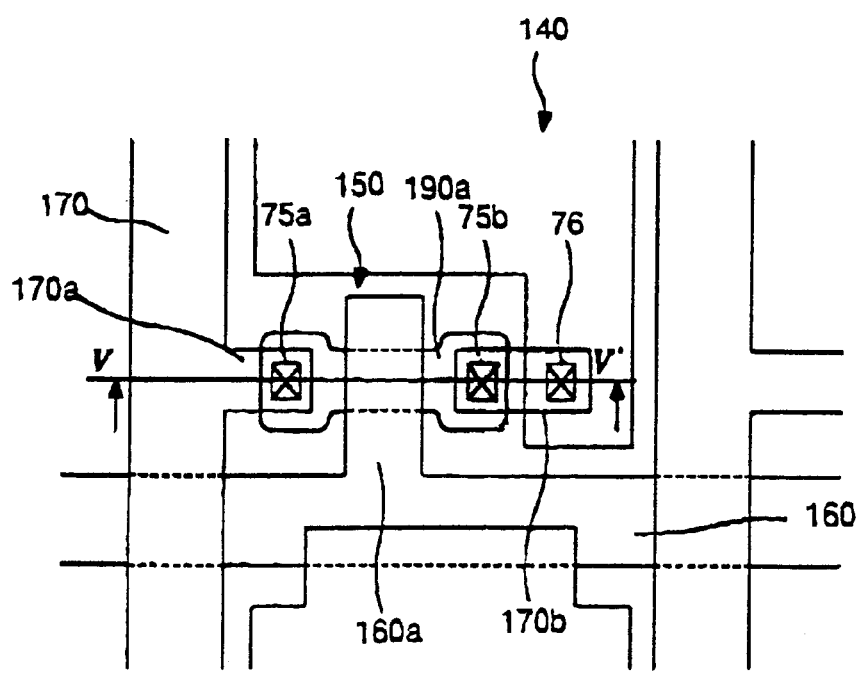
FIG. 4 is a plan view illustrating a coplanar type Poly-Si TFT according to a preferred embodiment of the present invention.
Figure 5:
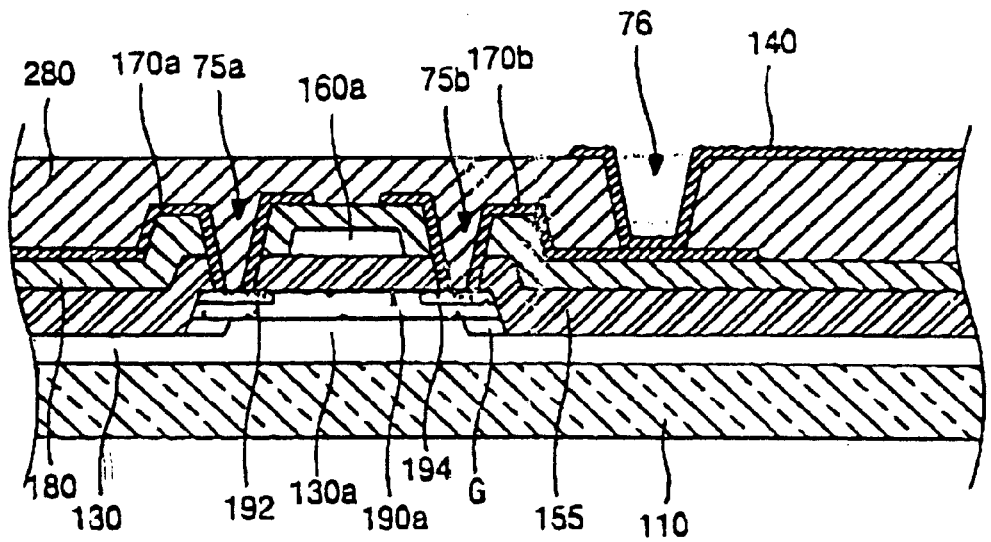
FIG. 5 is a cross-sectional view taken along line V—V of FIG. 4.

As shown in FIG. 4, data lines 170 are arranged in a longitudinal direction, and gate lines 160 are arranged in a transverse direction perpendicular to the data lines 170. Also, pixel electrodes 140 are arranged in cross regions defined by the data and gate lines 170 and 160, and Poly-Si TFTs 150 are arranged nearby the cross point of the data and gate lines 170 and 160.

The Poly-Si TFT 150 includes a gate electrode 160a extended from the gate line 160, a source electrode 170a extended from the data line 170a, a drain electrode 170b horizontally spaced apart from the source electrode 170a and contacting with the pixel electrode 140 through a contact hole 76, and a polycrystalline silicon layer 190 as an active area.

A method of manufacturing a Poly-Si TFT according to a preferred embodiment of the present invention will be explained in detail referring to FIGS. 5 to 8. A buffer layer 130 made of SiNx, SiO$_2$, or BCB (Benzocyclobutene) is formed on a transparent substrate 110. Amorphous silicon is deposited on the buffer layer 130 and patterned to form an amorphous silicon layer having preferably an "H" shape.

Figure 8:
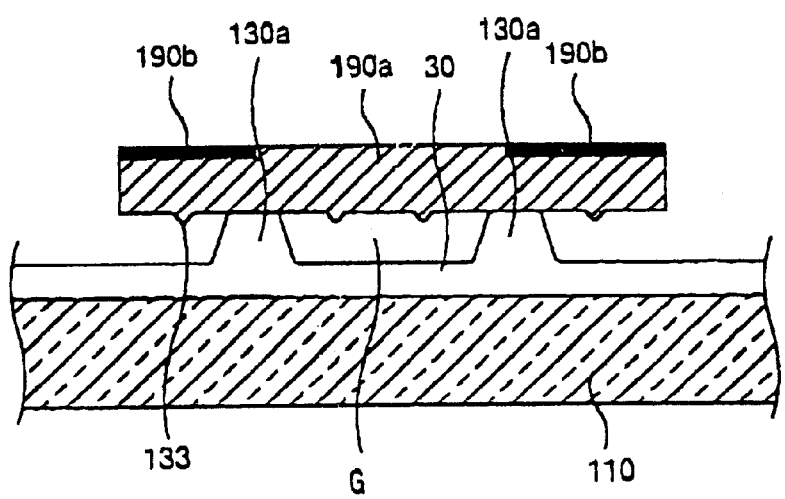
FIG. 8 is a cross sectional view taken along line VIII—VIII of FIG. 7B.

As partially shown in FIG. 8, the buffer layer 130 is over-etched along the H-shaped amorphous silicon layer to produce a supporting portion 130a and a space "G" formed between the amorphous silicon layer and the buffer layer 130.

Figure 6A:
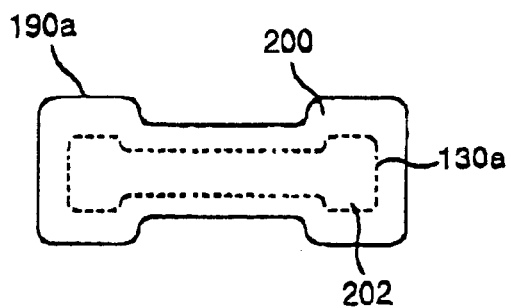
FIG. 6A is a plan view illustrating a polycrystalline silicon layer formed on a buffer layer according to the preferred embodiment of the present invention.
Figure 6B:
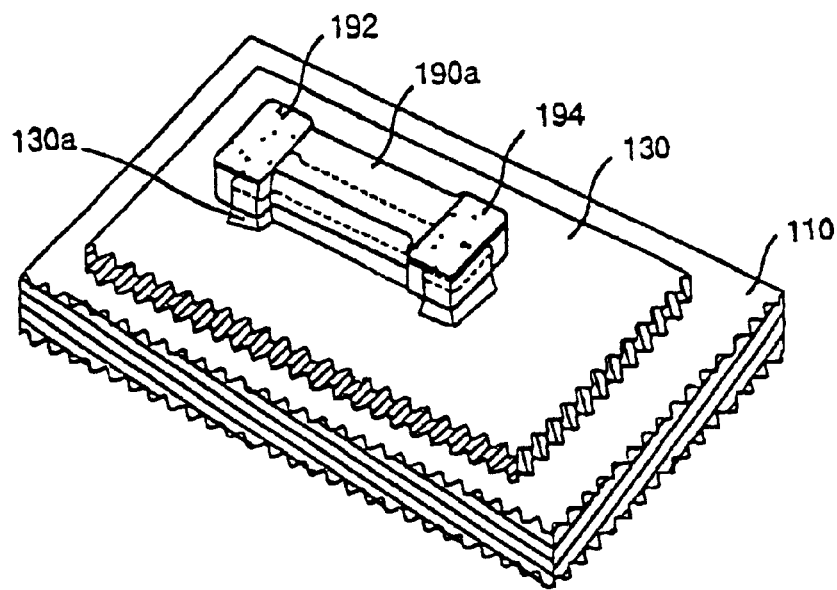
FIG. 6B is a perspective view showing the polycrystalline silicon layer formed on the buffer layer of FIG. 6A.
Figure 7A:
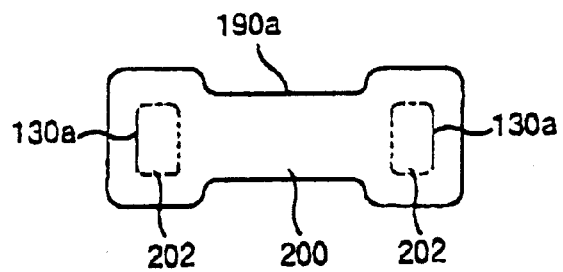
FIG. 7A is a plan view illustrating a polycrystalline silicon layer formed on a modified buffer layer according to the preferred embodiment of the present invention.
Figure 7B:
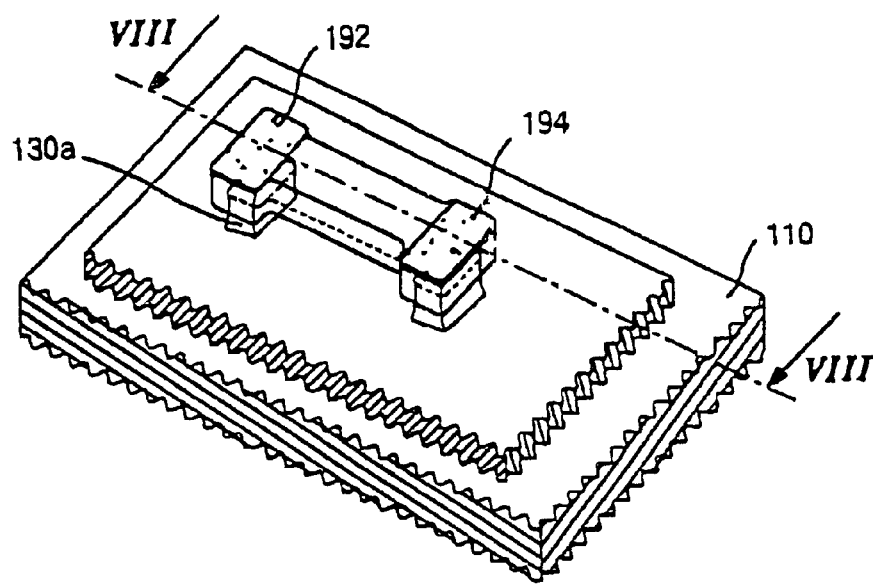
FIG. 7B is a perspective view showing the polycrystalline silicon layer formed on the buffer layer of FIG. 7A.

The supporting portion 130a of the buffer layer 130 can have an "H" shape as shown in FIGS. 6A and 6B, or have a shape of two poles as shown in FIGS. 7A and 7B.

The amorphous silicon layer can have other shapes such as a rectangle or triangle. The lower surface of the silicon layer has a noncontacting area 200 that does not contact with the supporting portion 130a and a contacting area 202 that contacts with the supporting portion 130a such that the supporting portion 130a supports the amorphous silicon layer 190a through the contacting area 202. Preferably, the contacting portion of the buffer layer 130 and the amorphous silicon layer is as small as possible. That is, it is desirable that the contacting area 202 of the amorphous silicon layer is as small as possible.

Then, the amorphous silicon layer is heat-treated using a furnace annealing technique or a laser annealing technique to form an H-shaped polycrystalline silicon layer 190a.

The polycrystalline silicon layer 190a necessarily has elevated grain boundaries 133 (see FIG. 8) that lower the field effect mobility, but the elevated grain boundaries thereof are formed on the noncontacting area 200, i.e. in the space "G", and face toward a gravity direction. Therefore, the upper surface of the polycrystalline silicon layer 190a is substantially flat and the field effect mobility characteristic thereof is much improved. In other words, heat during the heat-treatment process transfers quickly from the amorphous silicon layer to the buffer layer 130 through the supporting portion 130a, and the grain boundaries 133 tend to grow toward the gravity direction. Thus, the grain boundaries grow downward along the noncontacting area 200 of the lower surface of the amorphous silicon layer, and since the supporting portion 130a below the amorphous silicon layer has a relatively small area, the grain boundaries have enough area to form downward. Although some of the elevated grain boundaries are formed on the upper surface of the polycrystalline silicon layer 190a corresponding to the contacting area 202 due to the supporting portion 130a below the polycrystalline silicon layer 190a, crystals of the upper surface of the polycrystalline silicon layer 190a corresponding to the contacting area 202 are comparatively smaller than those of the upper surface of the silicon layer 190a corresponding to the noncontacting area 200 and, therefore the elevated grain boundaries on the upper surface of the polycrystalline silicon layer 190a corresponding to the contacting area 202 are sufficiently small to have only a negligible effect. Therefore, the field effect mobility characteristic is much improved.

Sequentially, a first insulating layer 155 of SiNx or SiO$_2$ is formed on the polycrystalline silicon layer 190a and the exposed buffer layer 130. A metal layer of Cr, Al, or Mo is deposited over the polycrystalline silicon layer 190a and patterned to form the gate electrode 160a. Impurity ion gas is doped into the polycrystalline silicon layer 190a using the gate electrode 160a as a mask to form an ohmic contact layer on both ends of the polycrystalline silicon layer 190a to define source and drain regions 192 and 194. At this point, the source and drain regions 192 and 194 become n⁺-type when the doped ion gas is one of a nitrogen group, while the source and drain regions 192 and 194 become p⁺-type when the doped ion gas is one of a boron group. Sequentially, a second insulating layer 180 is formed over the entire substrate 10 while covering the gate electrode 160a and the first insulating layer 155. Then, contact holes 75a and 75b are respectively formed to expose the source and drain regions 192 and 194. A metal layer of Cr, Al, or Mo is deposited on the second insulating layer 180 and patterned to form source and drain electrodes 170a and 170b respectively contacted with the source and drain regions 192 and 194 through the contact holes 75a and 75b. A third insulating layer 280 of SiNx, SiO$_2$, or BCB is formed over the entire substrate while covering the source and drain electrodes 170a and 170b. A contact hole 76 is formed to expose the drain electrode 170b. Then, a pixel electrode 140 of ITO (Indium Tin Oxide) is formed on the third insulating layer 280 and contacts with the drain electrode 170b through the contact hole 76.

As described hereinbefore, the Poly-Si TFT according to the preferred embodiment of the present invention has a high field effect mobility.

While the invention has been particularly shown and described with reference to the preferred embodiment thereof, it will be understood by those skilled in the art that the foregoing and other changes in form and details may be made therein without departing from the spirit and scope of the invention. For example, the Poly-Si TFT according to a preferred embodiment of the present invention is a coplanar type and the present invention can be applied to a staggered type Poly-Si TFT.

What is claimed is:

1. A polycrystalline silicon thin film transistor connected to a gate line and a data line, comprising:
   a source electrode contacting the data line;
   a gate electrode contacting the gate line;
   a drain electrode spaced apart from the source electrode;
   a polysilicon layer having upper and lower surfaces, the lower surface having a contacting area and a noncontacting area, the polysilicon layer being positioned between and contacting the source and the drain electrodes, and acting as a channel in which electrons flow; and
   a buffer layer positioned under the polysilicon layer, the buffer layer having a supporting portion, the supporting portion supporting the lower surface of the polysilicon layer through the contact area of the lower surface of the polysilicon layer, thereby forming a space between the buffer layer and the noncontacting area of the lower surface of the polysilicon layer.

2. The transistor of claim 1, wherein the polysilicon layer has an "H" shape.

3. The transistor of claim 2, wherein the supporting portion has a corresponding shape to the polysilicon layer.

4. The transistor of claim 2, wherein the supporting portion has two poles, an end of each of the two poles contacting the lower surface of the polysilicon layer and supporting the polysilicon layer in a spaced relationship with respect to the buffer.

5. The polysilicon thin film transistor as recited in claim 1, further comprising:
   a transparent substrate below the buffer layer.

6. The polysilicon thin film transistor as recited in claim 1, wherein the upper surface of the polysilicon is substantially flat.

7. The polysilicon thin film transistor as recited in claim 6, wherein the number of elevated grain boundaries on the upper surface of the polysilicon layer is less than the number of elevated grain boundaries of the lower surface of the polysilicon layer.

8. The polysilicon thin film transistor as recited in claim 6, wherein the upper surface of the polysilicon is substantially free of elevated grain boundaries.

9. A method of fabricating a thin film transistor, comprising the steps of:
   providing a transparent substrate;
   forming a buffer layer on the transparent substrate;
   forming an amorphous silicon layer on the buffer layer;
   patterning the amorphous silicon layer;
   etching the buffer layer using the patterned amorphous silicon layer as a mask to form a noncontacting area in a bottom surface of the amorphous silicon layer,
   heat-treating the amorphous silicon layer to form a polysilicon layer;
   forming source and drain electrodes contacting the polysilicon layer; and forming a gate electrode between the source and the drain electrodes.

10. The method of claim 9, wherein the heat-treating process is done using a laser annealing technique.

11. The method of fabricating the polysilicon thin film transistor, as recited in claim 9, said step of heat-treating the amorphous silicon layer comprising:
   forming the polysilicon layer with an upper surface that is substantially flat and free of elevated grain boundaries.

* * * * *